(12) United States Patent
Chen

(10) Patent No.: US 6,185,518 B1
(45) Date of Patent: Feb. 6, 2001

(54) METHOD AND SYSTEM FOR LOGIC DESIGN CONSTRAINT GENERATION

(75) Inventor: Liang T. Chen, Saratoga, CA (US)

(73) Assignee: Sun Microsystems, Inc., Palo Alto, CA (US)

(*) Notice: Under 35 U.S.C. 154(b), the term of this patent shall be extended for 0 days.

(21) Appl. No.: 09/046,134

(22) Filed: Mar. 23, 1998

(51) Int. Cl.[7] .................................................. G06F 9/455
(52) U.S. Cl. .................................. 703/19; 716/6; 716/18
(58) Field of Search .............................. 703/14, 17, 19; 716/6, 18, 4, 5, 7, 1; 713/500; 714/72 L; 702/108, 117, 125

(56) References Cited

U.S. PATENT DOCUMENTS

| | | | |
|---|---|---|---|
| 5,465,216 | * 11/1995 | Rotem et al. | 716/5 |
| 5,541,849 | * 7/1996 | Rostoker et al. | 716/18 |
| 5,544,067 | * 8/1996 | Rostoker et al. | 703/14 |
| 5,553,276 | * 9/1996 | Dean | 713/500 |
| 5,572,437 | * 11/1996 | Rostoker et al. | 716/18 |
| 5,623,418 | * 4/1997 | Rostoker et al. | 716/1 |
| 5,696,771 | * 12/1997 | Beausang et al. | 714/726 |
| 5,870,308 | * 2/1999 | Dangelo et al. | 716/18 |
| 5,880,971 | * 3/1999 | Dangelo et al. | 716/6 |

OTHER PUBLICATIONS

J.A. Nestor et al., SALSA: A New Approach to Scheduling with Timing Constraints, IEEE Transactions on Computer–Aided Design of Integrtaed Circuits and Systems, vol. 12, No. 8, Aug. 1993, pp. 1107–1122.*

Chin–Tung Chen et al., A Hybrid Numeric/Symbolic Program for Checking Functional and Timing Compatibility of Synthesized Designs, Proceedings of the Seventh Int'l Symposium on High–Level Synthesis, 1994, pp. 112–117.*

Jie Liu et al., Software Timing Analysis Using HW/SW Cosimulation and Instruction Set Simulator, Proceedings of the Sixth Int'l Workshop on Hardware/Software Codesign, 1988, CODES/CASHE '98, pp. 65–69.*

* cited by examiner

Primary Examiner—Kevin J. Teska
Assistant Examiner—Russell W. Frejd
(74) Attorney, Agent, or Firm—Finnegan, Henderson, Farabow, Garrett & Dunner, L.L.P.

(57) ABSTRACT

A system and method for generating design constraints for a logic synthesized block from timing analysis of the block. A timing analysis of logic described in software is performed for each of various operating modes of a circuit in which the logic is used. Timing data is extracted from the timing analysis and used as design constraints in the synthesis of the logic for the block.

27 Claims, 3 Drawing Sheets

|         | MODE 1 | MODE 2 | MODE 3 |
|---------|--------|--------|--------|
| PIN IN1 | 2.3 ns | 2.6 ns | 3.1 ns |
| PIN IN2 | 1.5 ns | 1.4 ns | 1.2 ns |
| PIN OUT1 | 5.4 ns | 5.6 ns | 6.1 ns |
| PIN OUT2 | 3.6 ns | 3.2 ns | 3.3 ns |

SIGNAL ARRIVAL TIMES (MODE 1, MODE 2, MODE 3 for PIN IN1, PIN IN2)

SIGNAL DEPARTURE TIMES (MODE 1, MODE 2, MODE 3 for PIN OUT1, PIN OUT2)

*FIG. 4*

METHOD AND SYSTEM FOR LOGIC DESIGN CONSTRAINT GENERATION

FIELD OF THE INVENTION

An embodiment of the present invention relates generally to the field of logic design and, more particularly, to the derivation of design constraints for synthesis of logic blocks.

BACKGROUND

Traditionally, the long, and often tedious, process of digital logic design was carried out by hand. Using a variety of design techniques or heuristic methods, designers constructed logic circuits from available design components. Depending on the task at hand, these design components could be low level components such as transistors, flip-flops or logic gates (e.g., AND gates, OR gates, and NOT gates), higher level components such as counters, multiplexers, random access memories (RAMs), or even microprocessors, or a combination of high and low level components. The designer also had a choice between logic components that performed the same overall function, but that operated at different speeds or that consumed less energy.

Increasingly, however, designers of digital logic rely on computer aided design ("CAD") programs, such as "Design Compiler," by Synopsys, Inc. of Mountain View, Calif., to assist in the synthesis of logic circuits. Using CAD programs, designers can design digital logic circuits using a hardware description language instead of working with discrete logic components. Hardware description languages allow the designer to specify the operation of a logic circuit in software. More specifically, designers specify the flow of signals within the circuitry and the logic functions performed on those signals. Presently, this type of program is written at the so-called "data flow level." Once the designer has programmed the operation of the logic circuit, the CAD program analyzes the program and synthesizes the corresponding logic circuit. The CAD program determines the appropriate logic components and interconnections between components to realize a circuit that satisfies the data flow model. CAD programs are also frequently used to analyze and optimize the performance of gate-level designs. In that case, the input to the CAD program is a gate level design description, as opposed to a data flow level description. The CAD program analyzes the gate level design and synthesizes an improved gate level design.

The synthesized or analyzed logic blocks are often interconnected with other logic blocks to form larger digital logic circuits. However, an important consideration in interconnecting logic blocks is the timing constraints at the interface of the blocks. For example, assume that each of the logic blocks B1, B2, and B3 of FIG. 1 is a block of digital logic to be synthesized or an existing gate level design to be analyzed by a CAD program, and that the blocks are to be interconnected as shown. Block B2 receives signals from block B1, and sends signals to block B3. To choose the correct kind and type of components for the blocks, it is necessary to know how fast block B2 can expect to receive signals from block B1, and how long it will take block B2 to process those signals before passing them to block B3. In other words, it is necessary to determine the time constraints at the boundaries of the blocks.

Traditional CAD programs determine time constraints by performing a static timing analysis using a single simulation of the data flow or gate level description of the logic circuit. Static timing analysis finds all the possible timing paths in the circuit through an exhaustive search, and then calculates the timing values of signals on each path to determine if the signal of any path will cause a timing violation (i.e., circuit malfunction). Based on this simulation, the CAD program synthesizes or refines the logic blocks using logic components and interconnections appropriate to the time constraints.

This technique, however, does not always provide accurate timing data. The time it takes logic circuits to process signals depends on various factors, such as the path the signals take through the logic circuit, whether the digital signals are transitioning from high to low versus low to high, and what mode the circuit is operating in. If the circuit is operating in conjunction with a RAM, for example, signals will be processed at different speeds when the circuit is writing to the RAM or reading from the RAM. Moreover, during a static timing analysis, the CAD program does not know the actual circuit state. It therefore assumes the worst case scenario to calculate the timing delay values and the signal timing of each path. The worst case scenario, however, may include analyses of a number of false paths, paths that never occur in real circuit operation. Using a single simulation to obtain timing constraints, current CAD programs do not account for these possible timing variations. Thus, the corresponding synthesized logic circuit may not operate correctly under all operating conditions.

In light of the foregoing, there is a need for a method and system to determine timing constraints from timing data that accurately captures the different operating conditions of a digital logic circuit.

SUMMARY OF THE INVENTION

Methods and systems consistent with the present invention for determining timing constraints between synthesized logic blocks result in a robust design of digital circuitry. In particular, these methods and systems take into account timing variations in the digital logic caused by various factors, such as different circuit operating modes, to synthesize circuitry for operation under the full range of possible operating conditions.

Additional features and advantages of the invention will be set forth in the description which follows, and in part will be apparent from the description, or may be learned by practice of the invention. The objectives and other advantages of the invention will be realized and attained by the system and method particularly pointed out in the written description and claims hereof as well as the appended drawings.

To achieve these and other advantages and in accordance with the purpose of the invention, as embodied and broadly described, a method for generating design constraints for synthesis of a logic block includes the steps of simulating operation of the logic block for a plurality of operating modes, storing timing data for the operating modes, and deriving design constraints from the stored timing data.

A system consistent with this invention includes a processor configured to simulate the operation of the logic block for a plurality of operating modes, and a memory configured to store timing data for the operating modes, wherein the processor is configured to derive design constraints from the stored timing data.

In another aspect, a method consistent with this invention includes the steps of simulating the operation of the logic block for a plurality of operating modes, for each operating mode, storing signal arrival times for at least one input boundary pin and signal departure times for at least one output boundary pin of the logic block, selecting the latest signal arrival time for the input boundary pins, and selecting the earliest signal departure time for the output boundary pins.

In another aspect, a computer-readable medium consistent with this invention contains instructions for controlling a system to perform a method including the steps of simulating operation of the logic block for a plurality of operating modes, storing timing data for the operating modes, and deriving design constraints from the stored timing data.

BRIEF DESCRIPTION OF THE DRAWINGS

The accompanying drawings, which are incorporated in and constitute a part of this specification, illustrate an embodiment of the invention and, together with the description, serve to explain the advantages and principles of the invention. In the drawings.

FIG. 4 is a table of timing data as can be used in an embodiment of the present invention.

DETAILED DESCRIPTION

Reference will now be made in detail to an embodiment of the present invention as illustrated in the accompanying drawings. Both the foregoing general description and the following detailed description are exemplary and explanatory and do not restrict the invention as claimed.

As described in more detail below, the embodiment generally involves the derivation of design constraints for the synthesis or analysis of digital logic. First, a digital logic block is represented as a software model, either at the data flow or gate level. A timing analysis of the software model is then performed for the different operating modes of the logic block. Finally, the most stringent timing data from the timing analyses is collected and used as a design constraint in the actual synthesis of the logic for the logic block. As used herein, the phrase "operating modes" refers broadly to any condition or set of conditions under which a logic block may function differently than it does under a different condition or set of conditions. Examples of operating modes are set forth in the description below. In addition, the term "synthesis," as used herein, refers to the process of operating on any representation or version of digital logic to combine, alter, generate, or refine the logic.

Figure 2:
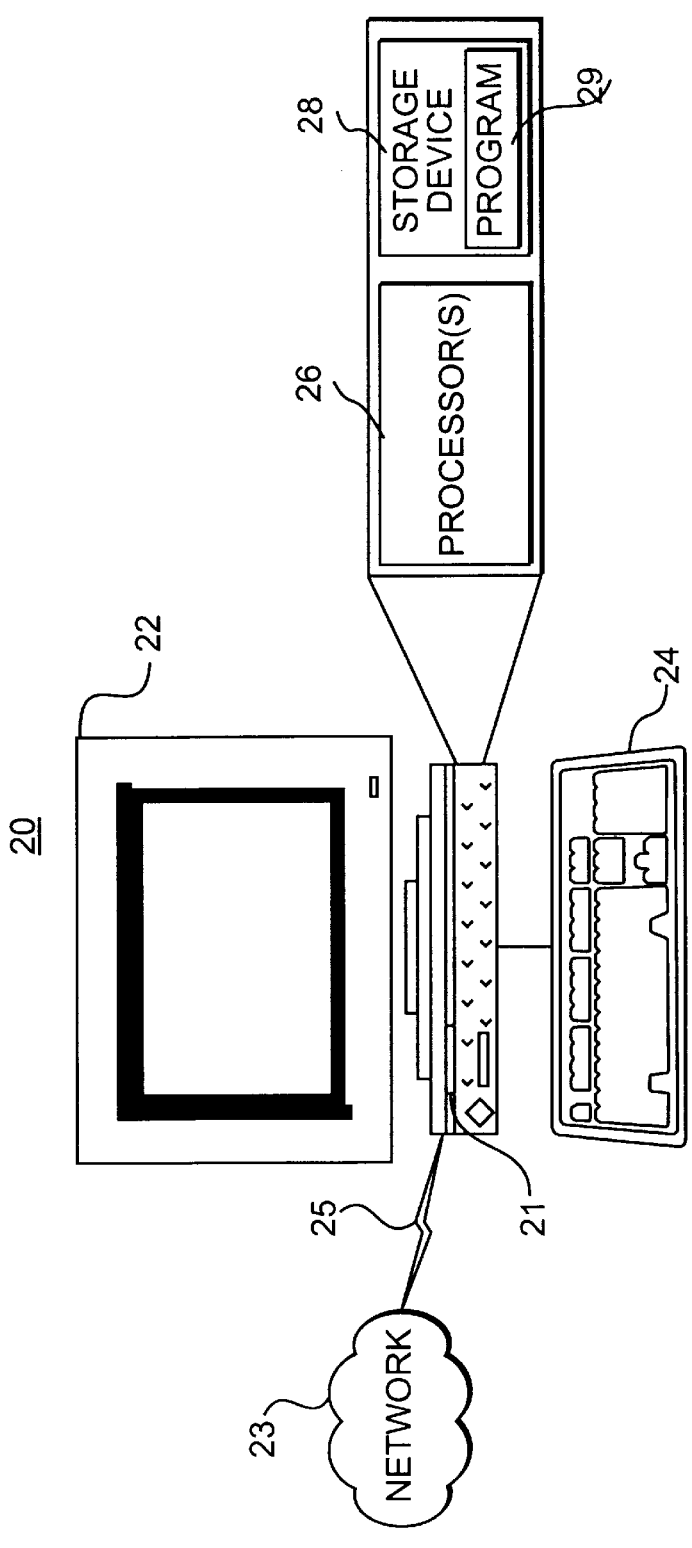
FIG. 2 is a drawing of a computer system consistent with the an embodiment of the invention.

FIG. 2 shows a system for implementing the embodiment. The system includes a computer 20 having a display 22 and an input device, such as a keyboard 24. Any other input device, such as a mouse or touch-screen, could also be used in place of or in conjunction with keyboard 24. The system further includes a processor or processors 26, and a storage device 28, such as a RAM. Storage device 28 contains a CAD program 29 executed by a processor or processors 26. Although an exemplary embodiment of the present invention is described as being stored in storage device 28, one skilled in the art will appreciate that it may also be stored on other computer-readable media, such as secondary storage devices like hard disks, floppy disks, CD-ROM, or DVD-ROM read by drive 21; a carrier wave received over a connection 25 from a network 23, such as the Internet or a secure server; or other forms of RAM or ROM. Additionally, one skilled in the art will appreciate that computer 20 may contain additional or different components.

Figure 1:
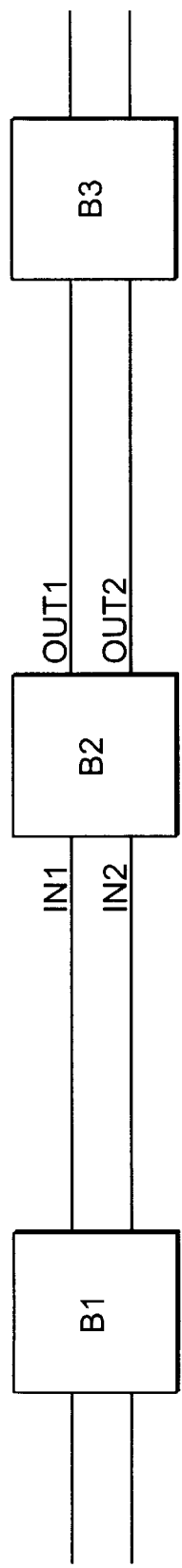
FIG. 1 is a drawing of an interconnection of logic blocks.

The embodiment will be described with respect to the configuration of logic blocks shown in FIG. 1. It should be noted, however, that the present invention is not limited by the number of logic blocks or interconnections. As shown, block B2 is connected to block B1 at pins in1 and in2, and to block B3 at pins out1 and out2. For purposes of this description, logic blocks B1, B2, and B3 are described in CAD program 29 at the data flow level, gate level, or in any other representation suitable for logic synthesis and analysis.

Figure 3:
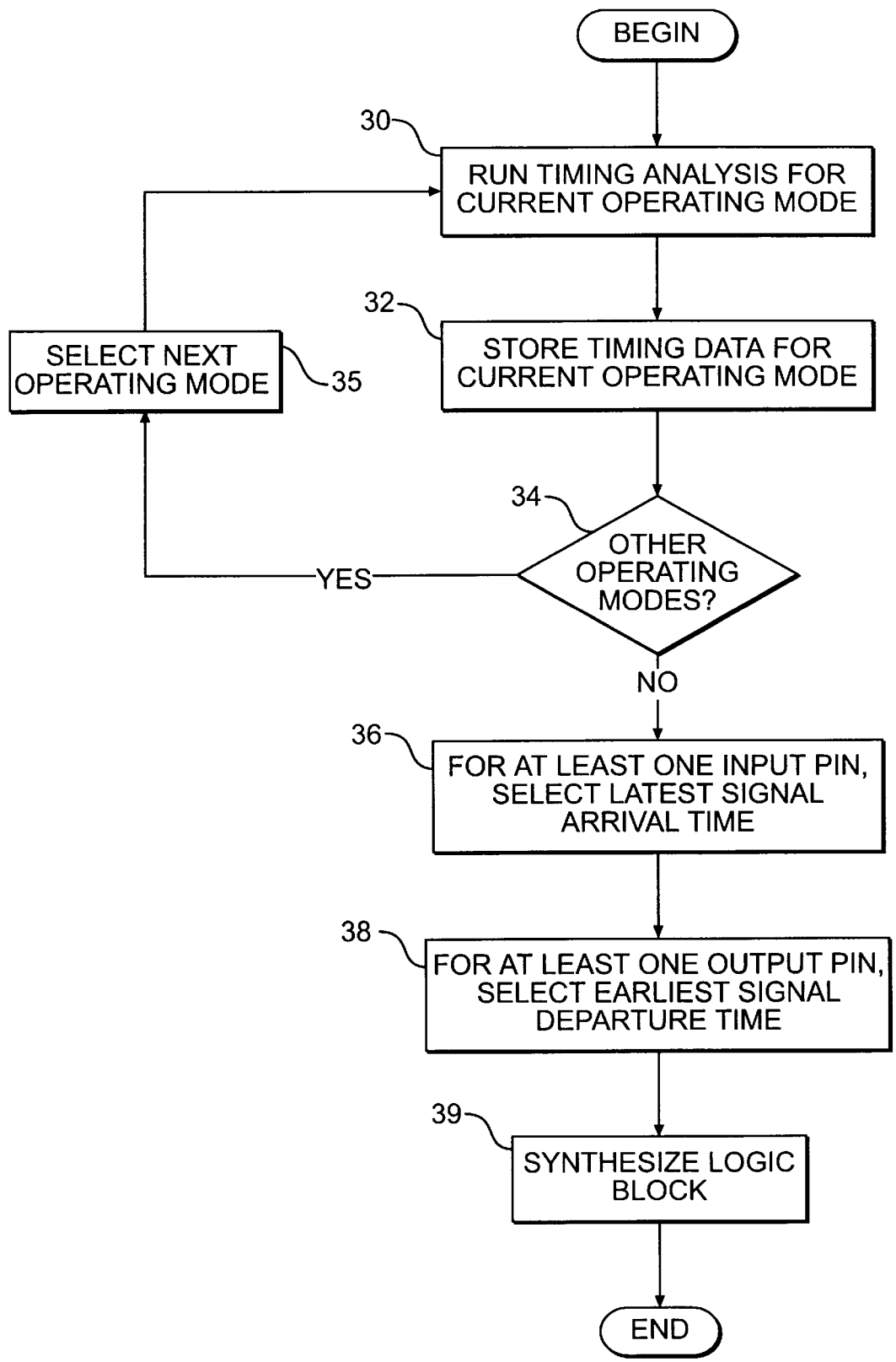
FIG. 3 is a drawing of a flowchart showing steps consistent with an embodiment of the present invention.

To synthesize the logic for block B2, it is necessary to determine the timing constraints at the interface of block B2 with other logic blocks. The constraints should take into account the most stringent timing data; that is, the latest arrival times that block B2 can expect to receive signals from block B1, and the earliest departure times that block B2 will propagate the signals to block B3. To derive these timing constraints, CAD program 29 follows the algorithm set forth in FIG. 3.

First, CAD program 29 runs a static timing analysis of the logic in a first mode (step 30). Program 29 then accumulates and stores the timing data at each boundary pin of the blocks being synthesized (step 32). Carrying forward the above example, program 29 accumulates and stores timing data for block B2. Examples of recorded timing data for connections in1, in2, out1, and out2 are shown in FIG. 4.

Program 29 then determines if there are other operating modes associated with the circuit (step 34). If so, program 29 selects the next operating mode (step 35) and repeats the timing analysis (step 30). This loop continues until timing data for all the circuit's operating modes have been stored. If the circuit included or was used in conjunction with a RAM, these modes could include, for example, a read mode and a write mode. As another example, if the circuit included or was used in conjunction with a microprocessor, the modes could include a normal operating mode, a test mode, a debug mode, and an idle mode. Assuming three modes of operation, the timing data recorded for the second and third modes is shown in FIG. 4.

At this point, program 29 has run a timing analysis of the circuit in each of its operating modes and has recorded timing data for each connection of block B2. Program 29 then derives the design constraints from the stored data (steps 36 and 38). Specifically, program 29 chooses the latest signal arrival time for the input connections (step 36), and the earliest signal departure times for the output connections (step 38). For pins in1 and in2, the latest arrival times are 3.1 ns and 1.5 ns, respectively. For pins out1 and out2, the earliest departure times are 5.4 ns and 3.2 ns, respectively. Using these timing values as design constraints, program 29 can then synthesize or refine logic for block B2 that more accurately and realistically reflects actual circuit operation (step 39).

In sum, the embodiment consistent with the present invention collects timing data from static timing analyses performed on a software model of digital logic block. The timing analyses are performed and data is collected for each of the logic block's operating modes. The most stringent timing data for each boundary pin of the logic block is then selected and used as a design constraint to synthesize the logic for the block.

It will be apparent to those skilled in the art that various modifications and variations can be made in the systems and methods consistent with the present invention without departing from its spirit or scope. The present invention covers the modifications and variations of this invention provided they come within the scope of the appended claims and their equivalents.

I claim:

1. A method for generating design constraints for synthesis of a logic block comprising the steps of:
   simulating operation of the logic block for a plurality of operating modes;
   storing timing data for the operating modes; and
   deriving design constraints from the stored timing data.

2. The method of claim 1 wherein the simulating step includes the step of:
   analyzing the operation of the logic block in one or more of a read mode and a write mode.

3. The method of claim 1 including the additional step of:
   representing the logic block at the data flow level before simulating its operation.

4. The method of claim 1 including the additional step of:
   representing the logic block at the gate level before simulating its operation.

5. The method of claim 1 wherein the storing step includes the step of:
   storing timing data for at least one boundary pin of the logic block.

6. The method of claim 5 wherein the storing step further includes the steps of:
   storing signal arrival times for at least one input boundary pin of the logic block; and
   storing signal departure times for at least one output boundary pin of the logic block.

7. The method of claim 6 wherein the deriving step includes the steps of:
   selecting the latest signal arrival time for the input boundary pins; and
   selecting the earliest signal departure time for the output boundary pins.

8. The method of claim 1 including the additional step of:
   generating logic for the logic block using the derived design constraints.

9. A system for generating design constraints for synthesis of a logic block comprising:
   a processor configured to simulate the operation of the logic block for a plurality of operating modes; and
   a memory configured to store timing data for the operating modes;
   wherein the processor is configured to derive design constraints from the stored timing data.

10. The system of claim 9 wherein the processor simulates the operation of the logic block in one or more of a read mode, a write mode, and/or an idle mode.

11. The system of claim 9 wherein the logic block is represented at the data flow level.

12. The system of claim 9 wherein the logic block is represented at the gate level.

13. The system of claim 9 wherein the memory stores timing data for at least one boundary pin of the logic block.

14. The system of claim 13 wherein the memory stores signal arrival times for at least one input boundary pin of the logic block and signal departure times for each output boundary pin of the logic block.

15. The system of claim 14 wherein the processor selects the latest signal arrival time for each input boundary pin and the earliest signal departure time for each output boundary pin.

16. A method for generating design constraints for synthesis of a logic block comprising the steps of:
   simulating the operation of the logic block for a plurality of operating modes;
   for each operating mode, storing signal arrival times for at least one input boundary pin and signal departure times for at least one output boundary pin of the logic block;
   selecting the latest signal arrival time for the input boundary pins; and
   selecting the earliest signal departure time for the output boundary pins.

17. The method of claim 16 including the additional step of:
   representing the logic block at the data flow level before simulating its operation.

18. The method of claim 16 including the additional step of:
   representing the logic block at the gate level before simulating its operation.

19. The method of claim 16 including the additional step of:
   synthesizing logic for the logic block using the selected arrival and departure times.

20. A computer-readable medium containing instructions for controlling a system to perform a method comprising the steps of:
   simulating operation of the logic block for a plurality of operating modes;
   storing timing data for the operating modes; and
   deriving design constraints from the stored timing data.

21. The computer-readable medium of claim 20 wherein the simulating step includes the step of:
   analyzing the operation of the logic block in one or more of a read mode and a write mode.

22. The computer-readable medium of claim 20 including the additional step of:
   representing the logic block at the data flow level before simulating its operation.

23. The computer-readable medium of claim 20 including the additional step of:
   representing the logic block at the gate level before simulating its operation.

24. The computer-readable medium of claim 20 wherein the storing step includes the step of:
   storing timing data for at least one boundary pin of the logic block.

25. The computer-readable medium of claim 24 wherein the storing step further includes the steps of:
   storing signal arrival times for at least one input boundary pin of the logic block; and
   storing signal departure times for at least one output boundary pin of the logic block.

26. The computer-readable medium of claim 25 wherein the deriving step includes the steps of:
   selecting the latest signal arrival time for the input boundary pins; and
   selecting the earliest signal departure time for the output boundary pins.

27. The computer-readable medium of claim 20 including the additional step of:
   generating logic for the logic block using the derived design constraints.

* * * * *